US012813170B2

(12) United States Patent
Lehtinen et al.

(10) Patent No.: US 12,813,170 B2
(45) Date of Patent: Nov. 24, 2026

(54) ATTENUATOR OR A DISSIPATING ELEMENT

(71) Applicant: Teknologian tutkimuskeskus VTT Oy, Espoo (FI)

(72) Inventors: Janne Lehtinen, Espoo (FI); Mika Prunnila, Espoo (FI); Nikolai Yurttagül, Espoo (FI); Alberto Ronzani, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 400 days.

(21) Appl. No.: 18/685,569

(22) PCT Filed: Aug. 23, 2022

(86) PCT No.: PCT/FI2022/050541
§ 371 (c)(1),
(2) Date: Feb. 22, 2024

(87) PCT Pub. No.: WO2023/025985
PCT Pub. Date: Mar. 2, 2023

(65) Prior Publication Data

US 2025/0132482 A1 Apr. 24, 2025

(30) Foreign Application Priority Data

Aug. 23, 2021 (FI) ...................................... 20215878

(51) Int. Cl.
*H01P 1/22* (2006.01)
*G01K 7/18* (2006.01)
(Continued)

(52) U.S. Cl.
CPC .............. *H01P 1/227* (2013.01); *G01K 7/186* (2013.01); *H01P 1/22* (2013.01); *H05K 7/2039* (2013.01);
(Continued)

(58) Field of Classification Search
CPC .... H01P 1/227; H01P 1/24; H01P 1/22; H01P 1/26; H01P 1/268; H10N 70/8613;
(Continued)

(56) References Cited

U.S. PATENT DOCUMENTS

2017/0257074 A1* 9/2017 Yeh ........................ G06N 99/00
2020/0074344 A1* 3/2020 Abdo ....................... H01P 5/184
2022/0045416 A1* 2/2022 Naaman ................ H01P 1/2039

FOREIGN PATENT DOCUMENTS

| | | | |
|---|---|---|---|
| EP | 0813046 | A1 | 12/1997 |
| WO | WO2020183060 | A1 | 9/2020 |
| WO | WO2021108032 | A1 | 6/2021 |

OTHER PUBLICATIONS

Bradley et al: Nanoelectronic primary thermometry below 4mK. Nature Communications, Jan. 27, 2016, vol. 7, No. 10455, 7 pages.

(Continued)

*Primary Examiner* — Stephen E. Jones
(74) *Attorney, Agent, or Firm* — Laine IP Oy

(57) ABSTRACT

An attenuator arranged to thermalize radio frequency components, or a dissipating element arranged to thermalize lower frequency components than the radio frequency components, comprising:

at least a first heat sink and a second heat sink; and at least one tunnel junction coupled to the first heat sink and the second heat sink, wherein the first heat sink and the second heat sink are capacitively grounded and arranged to provide heat dissipation via electron-phonon coupling; and wherein a combined resistance of the at least one tunnel junction and a heat sink coupled to it is below (Continued)

$$\frac{h}{e^2},$$

and/or a total capacitance of the first heat sink is above $$\frac{e^2}{2k_bT}$$

and a total capacitance of the second heat sink is above $$\frac{e^2}{2k_bT},$$

wherein h is the Planck constant, e is the elementary charge, $k_b$ is the Boltzmann constant and T is the minimum temperature, where the attenuator or the dissipating element is arranged to be used.

18 Claims, 7 Drawing Sheets

(51) Int. Cl.

*H05K 7/20* (2006.01)
*H10N 70/00* (2023.01)
*G06N 10/40* (2022.01)

(52) U.S. Cl.

CPC ....... *H10N 70/841* (2023.02); *H10N 70/8613* (2023.02); *H10N 70/8833* (2023.02); *G01K 7/183* (2013.01); *G06N 10/40* (2022.01)

(58) Field of Classification Search

CPC .. H10N 70/8833; H10N 70/841; G01K 7/186; G01K 7/183; H05K 7/2039; G06N 10/40
USPC ............................................ 333/81 R, 81 A
See application file for complete search history.

(56) References Cited

OTHER PUBLICATIONS

Koshelets et al: Josephson tunnel junction microwave attenuator. Applied Physics Letters, Dec. 6, 1993, vol. 63, No. 23, pp. 3218-3220.
Koski et al: Laterally proximized aluminum tunnel junctions. Applied Physics Letters, 2011, vol. 98, No. 203501, 5 pages.
Rastelli et al: Tunable ohmic environment using Josephson junction chains. Physical Review B, May 17, 2018, vol. 97, 11 pages.
Sarsby et al: 500 microkelvin nanoelectronics. Nature Communications, Mar. 27, 2020, vol. 7, No. 1492, 23 pages.
Wong et al: A tunable quantum dissipator for active resonator reset in circuit Qed. Quantum Science and Technology, Jan. 14, 2019, vol. 4, 18 pages.
Yeh et al: Hot electron heatsinks for microwave attenuators below 100 mK. Applied Physics Letters, Apr. 17, 2019, vol. 114, 4 pages.
Yurttagül et al: Coulomb blockade thermometry beyond the universal regime. Jun. 28, 2021, 16 pages.
Yurttagül et al: Indium as a High-Cooling-Power Nuclear Refrigerant for Quantum Nanoelectronics. Physical Review Applied, Jul. 31, 2019, vol. 12, 6 pages.
Blanchet et al: Radio-Frequency Coulomb-Blockade Thermometry. Physical Review Applied, Jan. 26, 2022, vol. 17, No. L011003, 5 pages.
Bradley et al: On-chip magnetic cooling of a nanoelectronic device. Scientific Reports, Apr. 4, 2017, vol. 7, No. 45566, 9 pages.
Kauppinen et al: Coulomb blockade thermometer: Tests and instrumentation. Review of Scientific Instruments, Dec. 1998, vol. 69, No. 12, pp. 4166-4175.
Sarsby et al: 500 microkelvin nanoelectronics. Nature Communications, Mar. 20, 2020, vol. 11, No. 1492, 7 pages.

* cited by examiner

ATTENUATOR OR A DISSIPATING ELEMENT

FIELD

Various example embodiments relate to attenuators and dissipating elements used in quantum technologies at ultra-low temperatures.

BACKGROUND

In quantum technologies, very low temperatures are required for reliable operation. Dilution refrigerators are cryogenic devices that may provide cooling to temperatures as low as few millikelvin (mK).

The need of interfacing classical control electronics at room temperature with quantum technologies, covering e.g. quantum electronics and/or a quantum processor, mounted at the dilution refrigerator mixing chamber requires progressive thermalization of a large number of signal lines to avoid unwanted thermal excitation of the quantum elements. Attenuators may be used to anchor signal temperature to the dilution refrigerator. Similarly, low frequency and direct current (DC) elements like passive voltage divider components may be used in anchoring biasing signals. At temperature below 1K, achieving thermalization is challenging due to the decay of electron-phonon coupling in conductors of practical interest.

SUMMARY

According to some aspects, there is provided the subject-matter of the independent claims. Some example embodiments are defined in the dependent claims. The scope of protection sought for various example embodiments is set out by the independent claims. The example embodiments and features, if any, described in this specification that do not fall under the scope of the independent claims are to be interpreted as examples useful for understanding various example embodiments.

According to a first aspect, there is provided an attenuator arranged to thermalize radio frequency components, or a dissipating element arranged to thermalize lower frequency components than the radio frequency components, comprising: at least a first heat sink and a second heat sink; and at least one tunnel junction coupled to the first heat sink and the second heat sink, wherein the first heat sink and the second heat sink are capacitively grounded and arranged to provide heat dissipation via electron-phonon coupling; and wherein—a combined resistance of the at least one tunnel junction and a heat sink coupled to it is below $$\frac{h}{e^2};$$

and/or—a total capacitance of the first heat sink is above $$\frac{e^2}{2k_bT}$$

and a total capacitance of the second heat sink is above $$\frac{e^2}{2k_bT},$$

wherein h is the Planck constant, e is the elementary charge, $k_b$ is the Boltzmann constant and T is the minimum temperature, where the attenuator or the dissipating element is arranged to be used.

According to a second aspect, there is provided a system comprising a dilution refrigerator; a quantum processor; and one or more attenuators or dissipating elements according to the first aspect and the embodiments thereof.

According to a third aspect, there is provided a tunnel junction structure comprising on a substrate a tunnel junction formed between normal metal layers, wherein the tunnel junction comprises an insulator layer between metal layers, wherein a first layer is a normal metal layer on the substrate, wherein material of the first layer is one of: TiW, Sc, W; a second layer is a metal layer on the first layer, wherein material of the second layer is one of: TiW, Sc, W, Ti, Al; a third layer is an insulator layer on the second layer, wherein material of the third layer is one of: TiOx, AlOx, WOx, ScOx; a fourth layer is a metal layer on the third layer, wherein material of the fourth layer is one of: TiW, Sc, W, Ti, Al; a fifth layer is a normal metal layer on the fourth layer, wherein material of the fifth layer is one of: TiW, Sc, or W.

According to a further aspect, there is provided an attenuator or a dissipating element of the first aspect comprising a tunnel junction structure of the third aspect.

DETAILED DESCRIPTION

Figure 1:
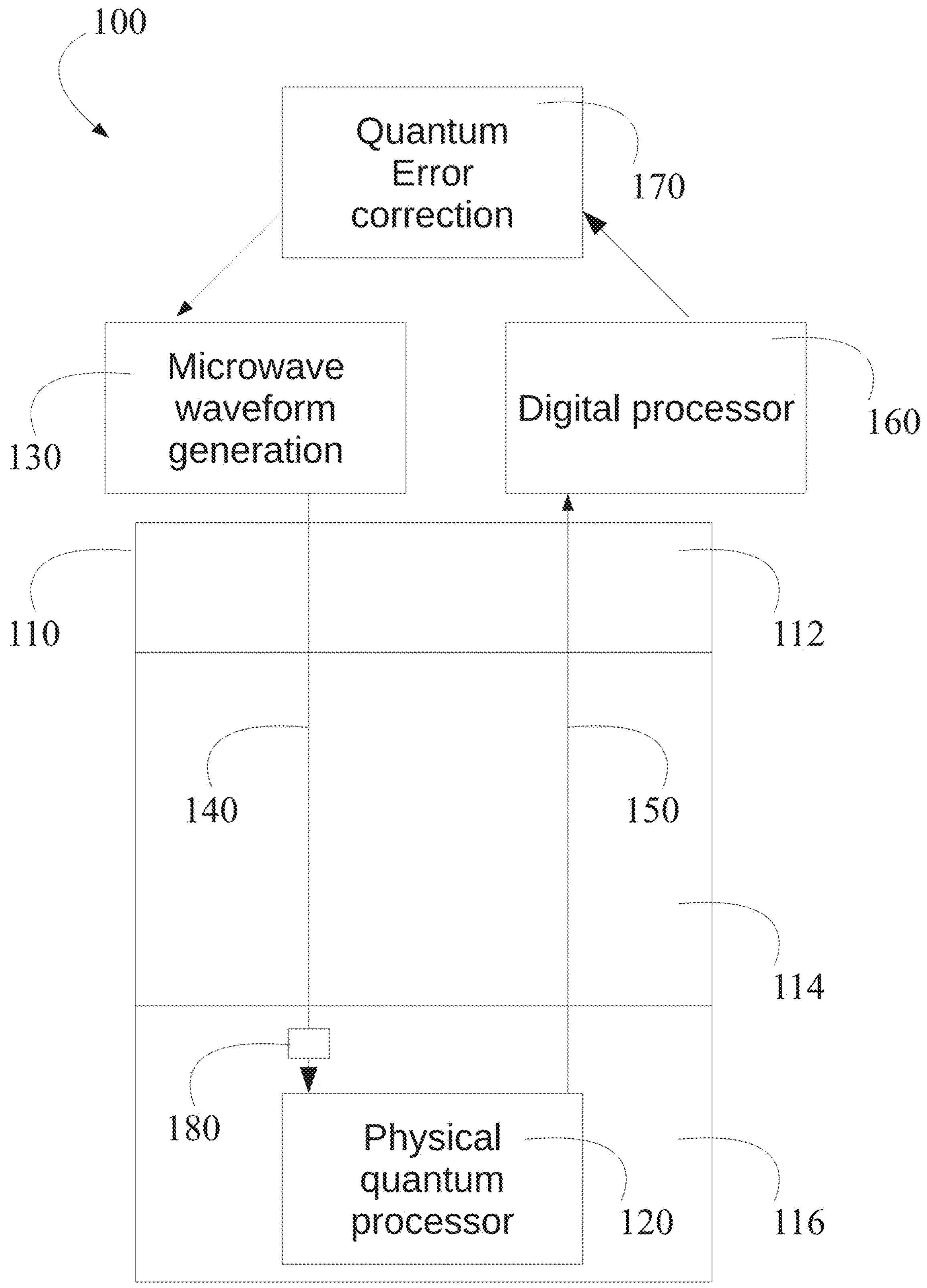
FIG. 1 shows, by way of example, a cryogenic refrigeration system.

FIG. 1 shows, by way of example, a cryogenic refrigeration system 100 for superconducting qubit setup. A dilution refrigerator 110 uses a mixture of Helium isotopes for the cooling process. The dilution refrigerator has a plurality of thermal stages of decreasing temperature. For example, a first stage 112 or plate may be at approximately 3 K or 4 K, a second stage 114 or plate may be at 1 K, and the final stage 116 may be a mixing chamber, which is the coldest area of the device. Temperature in the mixing chamber may be below 1 K, for example, less than approximately 15 mK or 20 mK. There may be a different number of stages, e.g. more stages, before the mixing chamber than illustrated in FIG. 1.

Quantum electronics, e.g. a physical qubit processor, or quantum processor 120, are located in a coldest part of a refrigerator, such as in the mixing chamber of a dilution refrigerator, cold finger of adiabatic magnetisation refrigerator, or low temperature stage of a solid stat cryogenic cooler. Temperature in these locations is very low, e.g. below 1 K, typically below 100 mK, even about 5 to 20 mK. Inputs 140 to the layer of physical qubits are control signals, and outputs 150 from the physical qubits are readout signals. Control signals, e.g. microwave pulses, are generated 130 at ambient temperature or room temperature, and the signals may be filtered and attenuated to reduce noise at the qubit. Amplifiers may be used to amplify the readout signals to ensure high-fidelity readout. Readout signals may then be processed e.g. by a digital processor 160, such as customized field-programmable gate arrays (FBGAs). Quantum error correction 170 process is performed at room temperature in the example of FIG. 1, but may be performed in the dilution refrigerator in future applications. Signal processing performed by the digital processor 160 is performed at room temperature in the example of FIG. 1, but may be performed in the dilution refrigerator in future applications. Quantum error correction processor is responsible for controlling the input and output functions.

Radio frequency (RF) cabling, or RF lines, comprises various microwave components such as attenuators, filters and amplifiers. RF lines are connected to the quantum processor and are used for its control and readout. Thus, RF lines, e.g. coax assemblies, connect ambient temperature, e.g. about 300 K, electronics to shielded enclosures cooled to temperature values close to absolute zero. Similarly low frequency and DC elements like thermalized passive voltage divider components and series resistors may be used in anchoring biasing signals. Insufficient line thermalization causes thermal excitations, for example leading to qubit dephasing.

For experiments targeting quantum systems, not only the enclosure, e.g. the dilution refrigerator, but also driving and diagnostic RF lines should be cooled to low temperatures. This way, spurious excitations that may cause errors in the manipulation and evolution of the delicate quantum states may be avoided.

Cables, attenuators, and microwave components need to be progressively thermalized in order to manage the heat load on each individual stage in the dilution refrigerator. For example, attenuators, such as connectorized RF attenuators, may be inserted to the RF lines. The attenuators thermalize the line to the available fixed-temperature points inside the dilution refrigerator. If not well thermalized, the noise temperature of the output port of the last attenuator couples to the quantum device thereby limiting coherence by high-energy non-equilibrium photons. Attenuators may be, for example, constituted by T-type or T-type networks of thin film resistors made of metal alloys, e.g. NiCr, TaN, etc. The metal film acts as a wide band, lossy element for the input signal. However, the metal alloys used in these thin-film resistors have large specific resistance, which may be dependent on the magnetic field thus causing unstable or non-reproducible operation. Additionally, these metal alloys have a weak electron-phonon coupling, i.e. coupling between electrons and lattice vibrations, which leads to overall inefficient thermalization of the signal in the attenuator. As a result, the final effective RF line temperature may be significantly higher (in excess of even 100 mK) than the base temperature in the dilution refrigerator. In order to achieve good thermalization, physically large resistor volumes are required. However, metal film resistors with big volumes may lead to non-flat frequency response e.g. in 1 to 20 GHz band, e.g. the 3 to 10 GHz band, due to finite-size effects, parasitic capacitance or inductance.

There is provided a dissipative device 180, in an attenuator, for efficient thermalization of RF lines, or a dissipating element arranged to thermalize lower frequency components than the RF components, e.g. DC to RF. The dissipative device may be located e.g. in the mixing chamber. Alternatively, the dissipative device may be located on a thermally conductive holder, which may be at least partly external to the mixing chamber but thermally coupled to the mixing chamber. Additionally, dissipative devices may be present as thermally anchoring points at higher temperature stages in the dilution refrigerator, for example, still plate, 3K plate et cetera. The cryogenic refrigeration system 100 may comprise one or more dissipative devices 180.

Figure 2A:
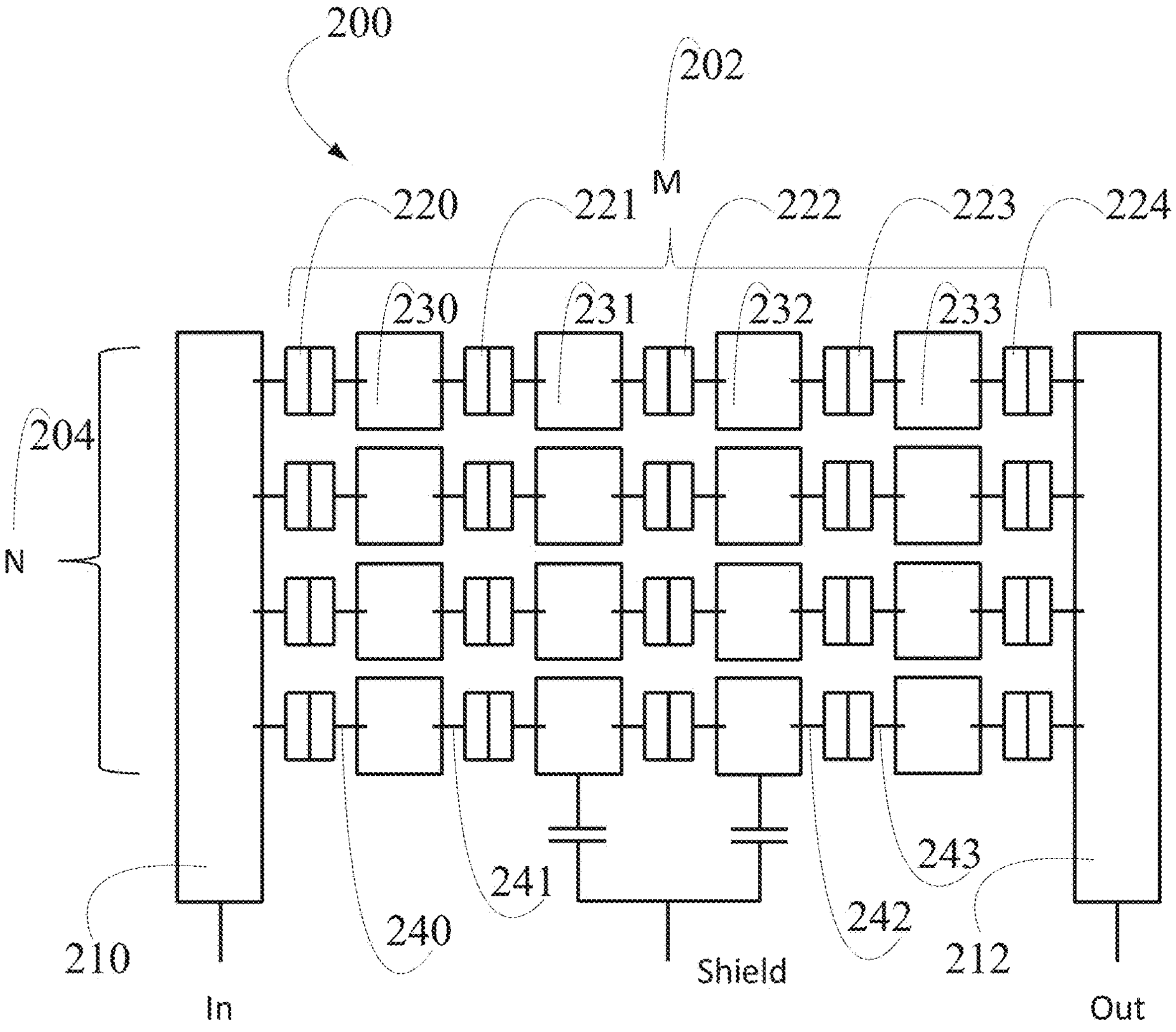
FIG. 2A shows, by way of example, a diagram of a dissipative device.

FIG. 2A shows, by way of example, a diagram of a dissipative device 200, which may be coupled in between an input electrode 210 and an output electrode 212. Material of the input and output electrodes may be e.g. gold, copper or aluminium, or some other suitable contact material. The device comprises an array of tunnel junctions 220, 221, 222, 223, 224. Array may be considered as a structure comprising N 204 rows and M 202 columns of basic elements. Basic element of the structure may be considered to consist of a tunnel junction connected to a heat sink. Electrodes 210, 212 may function as heat sinks. The size of an array may be chosen to be suitable for the application. For example, number of rows may be from 1 to a million. Number of columns may be e.g. one to a million. In the case of one tunnel junction assembly in the column the electrodes 210 and 212 operate as the only heat sinks. The ratio N/M may be chosen to be suitable for the application. For example, total impedance and/or total thermalization volume may affect the ratio N/M. Array may comprise one or more rows. The rows, e.g. each row, may comprise a plurality of tunnel junctions 220, 221, 222, 223, 224 e.g. at least a first tunnel junction 220, a second tunnel junction 221, and a third tunnel junction 222. Arrays may be combined in a circuit network, suitable to the application requirements, so that 200 is an impedance element in the network with shields potentially connected to ground or other common and the device which takes the external signal or is under a test is connected to one in/out impedance node. One example is voltage divider formed from the impedance elements.

Each heat sink or island is connected to the shield or ground plane. The shield is connected to the ground either capacitively or galvanically. FIG. 2A shows the grounding for two heat sinks for simplicity. In at least some embodiments, no additional shield layer is used but directly through chip capacitive coupling to a holder is used. Grounding may depend on a system geometry, for example.

The dissipative device comprises heat sinks 230, 231, 232, 233 in between the tunnel junctions, connected to the junctions' leads. For example, at least a first heat sink 230 is coupled to the first tunnel junction 220 and the second tunnel junction 221, and a second heat sink 231 is coupled to the second tunnel junction 221 and the third tunnel junction 222. The heat sinks are arranged to provide heat dissipation via electron-phonon coupling. Input 210 and output electrode 212 may operate as heat sinks and electrical conductors at the same time. The heat sinks may be implemented as separate islands, or as common heat sinks for different rows, as described in FIG. 3.

Figure 2B:
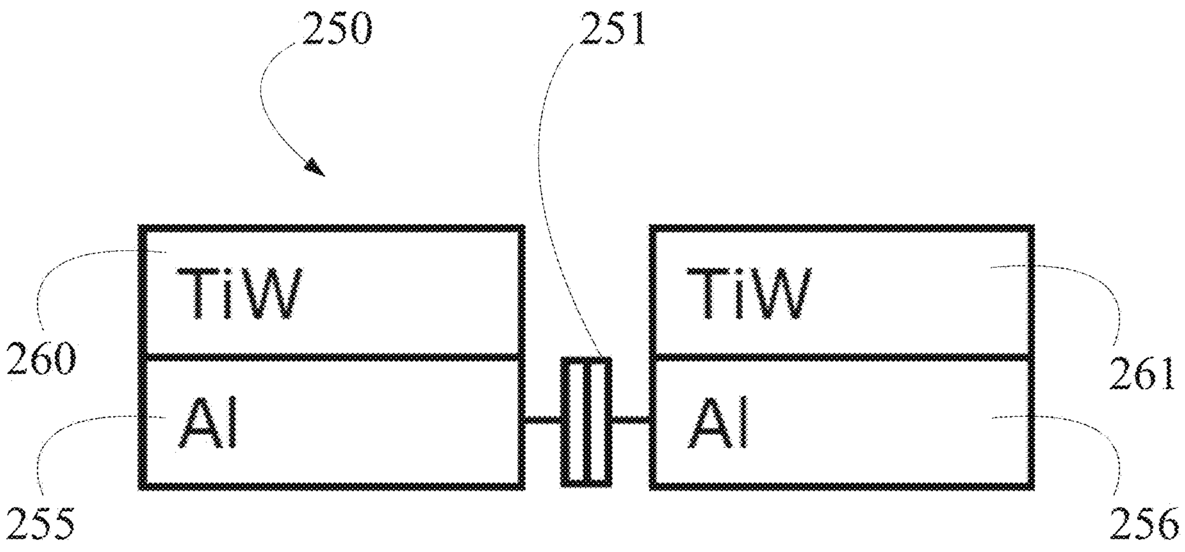
FIG. 2B shows, by way of example, a tunnel junction structure.
Figure 2C:
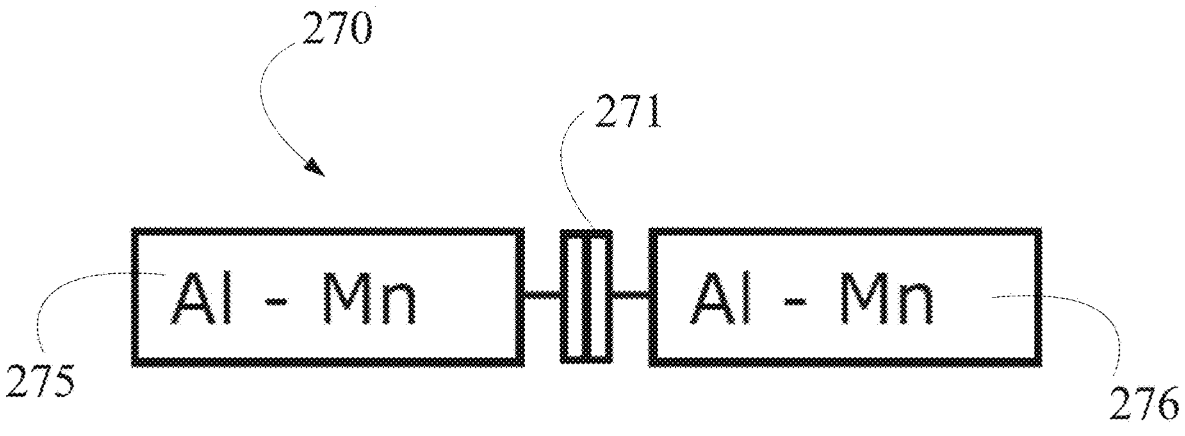
FIG. 2C shows, by way of example, a tunnel junction structure.
Figure 2D:
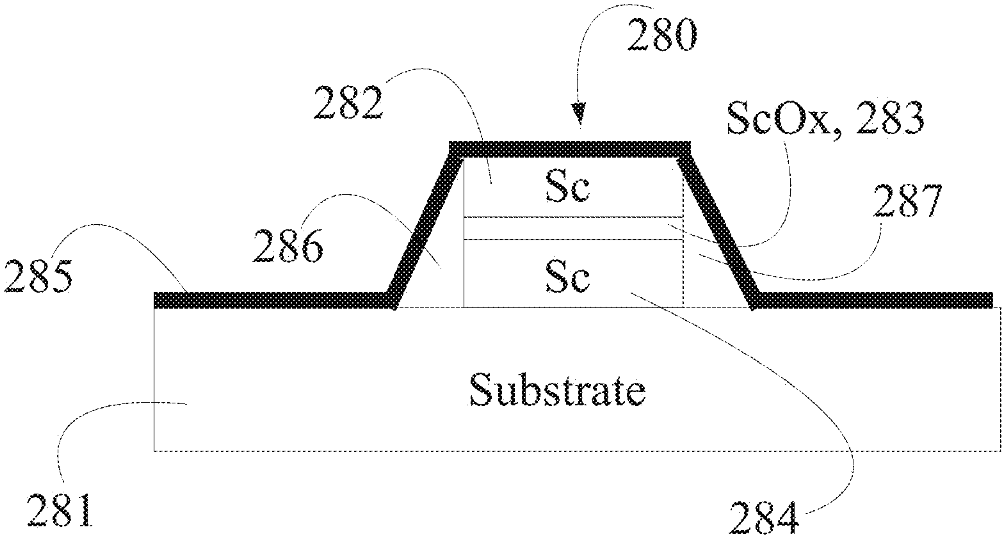
FIG. 2D shows, by way of example, a side view of a tunnel junction structure.

Tunnel junctions and heat sinks are electrically connected e.g. by metal layers 240, 241, 242, 243 which may be arranged on top of the tunnel junctions as shown in FIG. 2D.

Dielectric spacers may be arranged to the tunnel junction structures as shown in FIG. 2D to prevent electrical shorts between metal layers of the tunnel junction.

Each heat sink or island may be coupled to ground either directly or capacitively. Shield may function as a ground or may be connected to a ground. Shield may be connected capacitively to one or several heat sinks and to output and input electrodes.

When a dissipative device is used in a system, e.g. in a dilution refrigerator of FIG. 1, the system may have limitations related to total row capacitance. Depending on implementation, either separate or common heat sinks may provide better usability in terms of flatter or broader frequency response, for example. Separate heat sinks (FIG. 2A), that is, independent thermal units cause lower capacitance to shield. Common heat sinks (FIG. 3), that is, thermal units that are tied together (FIG. 3) cause higher capacitance to shield. Choosing between the structures may, in at least some embodiments, be a trade-off between suitability for the application and fault tolerance, for example. From fault tolerance point of view, structure of FIG. 3 with common shunt between rows may be beneficial, since a connection with other heat sinks may compensate in situation wherein one row is broken, for example. It may be that in some applications, for example for higher bandwidth operation, separate heat sinks are preferable.

The tunnel junctions and the heat sinks are formed on a substrate. Heat generated in the tunnel junctions may be conducted by the heat sinks to the substrate, and the hot electrons generated by the tunnel junctions may be cooled via electron-phonon coupling. When electrical power is dissipated, the electron temperature $T_e$ is driven out of equilibrium with the phonon temperature $T_p$. This leads to hot electron temperature, i.e. $T_e >> T_p$. In an individual heat sink, the net power at which heat is transferred from the electrons to the phonons may be given as $$P_{e-p} = V_m \sum (T_e^n - T_p^n),$$

wherein $V_m$ is the volume of the metal, and $\Sigma$ is a material-dependent parameter of electron-phonon coupling. The power n is also material dependent parameter and, for example, typically in pure metals n=5 is observed. Volume of the metal may refer to the total volume of any individual metallic element involved in the thermalization of its electron heat towards the phonon temperature in the heat sink element.

The tunnel junctions are localized resistive elements. The tunnel junctions are intrinsically in normal state over the whole operation temperature. This means that there is no superconductivity in the tunnel junctions. The junction may comprise an insulating layer, i.e. a dielectric barrier, which separates two heat sinks, e.g. metal electrodes. Alternatively, the junction may comprise a Schottky barrier between semiconductor and metal electrodes. The semiconductor may be doped. In the latter example, the junction may comprise a thin dielectric barrier, as well.

A barrier resistor element is formed by a conductor-insulator-conductor tunnel junction, e.g. a metal-insulator-metal tunnel junction. A tunnel junction comprises, or consists of, a sufficiently thin electrically insulating layer, forming a tunnel barrier between two electrically conducting volumes of the tunnel junction, e.g. metal volumes. It is desirable that the electrically conducting volumes are characterized by an absence of superconductivity. Absence of superconductivity can be obtained in: a) hybrid metal assemblies where ordinary superconductivity is suppressed by the inverse proximity effect (see FIG. 2B), or b) doped semiconductors, elemental metals or alloys of metals not showing a superconducting phase transition above 5 mK (see FIG. 2C). With absence of superconductivity, possible blocking of tunnelling of electrons caused by a superconducting energy gap may be prevented.

FIG. 2B shows, by way of example, a tunnel junction structure 250. For example, the metal-insulator-metal tunnel junction 251 may be formed by a stack of aluminium/aluminium oxide/aluminium. Aluminium is a superconductor, but the absence of superconductivity may be achieved by an arrangement, where the aluminium films 255, 256 are in galvanic contact with a titanium-tungsten layer 260, 261 in such a way that superconductivity is effectively suppressed in the aluminium films. Thickness of the AlOx layer may be e.g. approximately 1 to 3 nm.

FIG. 2C shows, by way of example, a tunnel junction structure 270. As in FIG. 2B, the metal-insulator-metal tunnel junction 271 may be formed by a stack of aluminium/aluminium oxide/aluminium. Alternatively to the example of FIG. 2B, superconductivity could be intrinsically absent in the described temperature range or suppressed by the inclusion of suitable amounts of a paramagnetic material in a superconductor 275, 276, for example the aluminium/manganese alloy. Thickness of the AlOx layer may be e.g. approximately 1 to 3 nm.

FIG. 2D shows, by way of example, a side view of a tunnel junction structure 280 on a substrate 281. The metal-insulator-metal tunnel junction may be formed by a stack of scandium 282/scandium oxide 283/scandium 284. Sc/ScOx/Sc tunnel junctions have large resistivities enabling formation of a sufficiently large tunnel barrier by ScOx. Thickness of the ScOx layer 283 may be e.g. approximately 1 to 3 nm. Scandium is not superconducting down to the lowest achievable temperatures so far. FIG. 2D shows also a top metal layer 285 traversing on top of the tunnel junction. The top metal layer enables electrical connection to other junctions and thermalization islands. Referring to FIG. 2A, the tunnel junctions, e.g. all the tunnel junctions, comprise a top metal layer 240, 241, 242, 243. Material of the top metal layer 285 may be any suitable metal, e.g. scandium (Sc), copper (Cu), tungsten (W), gold (Au). Some superconductors are not preferred materials for the top metal layer as such. The top metal layer 285 may be a stack of metals or alloy such as aluminium (Al), tin (Sn), titanium (Ti), if their superconductivity is neutralized to achieve low resistivity but not superconductivity. Absence of superconductivity may be achieved as described in the context of FIG. 2B and/or FIG. 2C. Structures of FIG. 2B and FIG. 2D may comprise dielectric spacers 286, 287. Material of a dielectric spacer 286, 287 may be e.g. $SiO_2$ or AlOx. The dielectric spacers prevents electrical shorts between the scandium elements 282, 284. Without the dielectric spacers, the top layer 285 would electrically connect the two sides of the junction.

Tunnel junction structures of FIG. 2B and FIG. 2C comprise dielectric spacers and top layers as well.

Figure 2E:
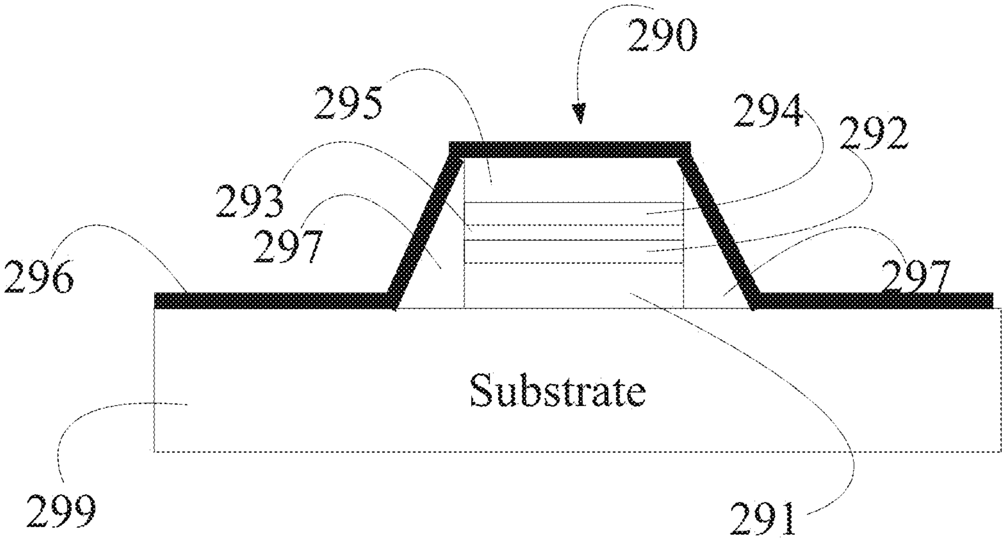
FIG. 2E shows, by way of example, a side view of a tunnel junction structure.

FIG. 2E shows, by way of example, a side view of a generic tunnel junction structure 290 on a substrate 299. The metal 294—insulator 293—metal 292 tunnel junction may be formed between normal metal layers 295, 291. The metal layers 294, 292 may be superconductive alone-inversely proximized to normal state by 294 and 291. Top metal layer 296 enables electrical connection to other junctions and thermalization islands. Dielectric spacers 297 prevents electrical shorts between the two sides of the junction. Possible material combinations for layers fifth layer 295, fourth layer 294, third layer 293, second layer 292, first layer 291 may be, for example TiW, Al, AlOx, Al, TiW;
TiW, Ti, AlOx, Al, TiW;
TiW, TiW, AlOx, Al, TiW;
TiW, Ti, TiOx, Ti, TiW;
TiW, W, WOx, W, TiW;
Sc, Sc, AlOx, Al, TiW; or
Sc, Sc, ScOx, Sc, Sc, respectively.

The metals and alloys non-superconducting in the temperature range of interest—Scandium (Sc), Tungsten (W), Titanium Tungsten (TiW)—and the superconducting metals—Aluminium (Al) and Titanium (Ti)—are compatible with deposition techniques in fabrication facilities where the use of metallic contaminants of semiconductors is otherwise forbidden. Their oxides (ScOx, AlOx, WOx, TiOx) are well suited to the realization of tunnel junctions as described above.

In at least some embodiments, the first layer 291 is a normal metal layer on the substrate, wherein material of the first layer is one of: TiW, Sc, W; the second layer 292 is a metal layer on the first layer, wherein material of the second layer is one of: TiW, Sc, W, Ti, Al; the third layer 293 is an insulator layer on the second layer, wherein material of the third layer is one of: TiOx, AlOx, WOx, ScOx; the fourth layer 294 is a metal layer on the third layer, wherein material of the fourth layer is one of: TiW, Sc, W, Ti, Al; the fifth layer 295 is a normal metal layer on the fourth layer, wherein material of the fifth layer is one of: TiW, Sc, or W.

Thickness of the insulating layer of the tunnel junctions affects controlling of the tunnelling resistance and junction capacitance. In addition, it may affect the controlling of the electrical capacitance of the junction. Different thicknesses may be used for tuning the circuit properties.

The heat sinks comprise thermalization fins. These are enabled by thick (e.g. 10 μm or >10 μm) metal volumes which are deposited between the barrier resistor elements to facilitate electronic thermalization at these points by coupling the electrons to lattice vibrations (phonons).

In at least some embodiments, large volume islands may be on a separate chip that is connected to attenuator island nodes, or heat sinks, galvanically, for example with flip chip. This kind of structure enables having the shield surrounding the attenuator or the dissipating element as full 3D plane may be used.

The materials used in heat sinks may be chosen so that the material does not become superconductive at ultra-low temperatures, since superconductivity might impede thermal flow. The thermalization fins are characterized by a strong interaction between electrons and phonons, by the absence of superconductivity down to 5 mK, and by the ability to deposit them locally as thick films by electrochemical deposition methods. Examples for suitable materials are gold (Au) and copper (Cu).

The heat sinks are metallic islands with large volume and good electron-phonon coupling, thus providing efficient thermalization of the attenuator. Combination of the tunnel junctions and the heat sinks enables bringing the noise temperature of the output port to the temperature of the dilution refrigerator. The heat sinks, which may be thick metallic volumes, may be realized between the junctions by masked electrodeposition of a metal with strong electron-phonon coupling, for example, or by sputter deposition, chemical vapour deposition (CVD) or atomic layer deposition (ALD).

The materials used in tunnel junctions and in heat sinks may be non-magnetic to ensure stable operation in varying magnetic fields. In at least some embodiments, the material used in heat sinks may comprise magnetic refrigeration coolants to enable adiabatic demagnetisation cooling.

Each tunnel junction has a resistance $R_{T,i,j}$. Each island has capacitance $C_{I,i,j}$. that includes the tunnel junction capacitance(s) and capacitance to the ground or shield, and resistance $R_{I,i,j}$. Indice j is for rows and i is for columns. Resistances $R_{I,i,j}$ may vary in the array or be nominally the same within the fabrication tolerances. Resistances $R_{T,i,j}$. may vary in the array or be nominally the same within the fabrication tolerances.

If the array is used as a passive component, such as an attenuator, filter or voltage divider, no single charge effects should be present to ensure linear operation of the device. This is in contrast to more traditional (normal) tunnel junction array use cases, such as Coulomb blockade thermometry, where the single charge effects provide the component functionality.

For a passive component, no single charge effects, or an amount of single charge effects which is small enough for the functionality of the passive component, are (is) present when the combined resistance of each individual tunnel junction and an island connected to it is below the resistance quantum $$R_{T,i,j} + R_{I,i,j} < \frac{h}{e^2} \approx 25.8\,k\Omega$$

for all i and j, where h is the Planck constant and e is the elementary charge, and/or the total capacitance of each island is larger than $$C_{I,i,j} > \frac{e^2}{2k_bT}$$

for all i and j, where $k_b$ is the Boltzmann constant and T is the minimum temperature, where the component is used, typically from few mK up to 100 mK. The total capacitance of the island includes junction capacitance(s) of the tunnel junction(s) connected to the island and capacitance to ground or shield.

To prevent or exclude or at least to minimize single charge effects, tunnel junctions and the islands are designed such that the combined resistance of each tunnel junction and an island connected to it is below the resistance quantum $$\frac{h}{e^2},$$

preferably below $$\frac{\hbar}{e^2},$$

where $\hbar$ is the reduced Planck constant.

In at least some embodiments, a combined resistance of the at least one tunnel junction and the first heat sink coupled to it is below the resistance quantum $$\frac{h}{e^2}$$

and a combined resistance of the at least one tunnel junction and the second heat sink coupled to it is below the resistance quantum $$\frac{h}{e^2}.$$

In at least some embodiments, the maximum resistance of any tunnel junction and a heat sink coupled to it cannot exceed the resistance quantum $$\frac{h}{e^2}.$$

In an array of tunnel junctions, a combined resistance of the second tunnel junction and the first heat sink coupled to it is below the resistance quantum, and a combined resistance of the second tunnel junction and the second heat sink coupled to it is below the resistance quantum, and a combined resistance of the third tunnel junction and the second heat sink coupled to it is below the resistance quantum.

In at least some embodiments, a combined resistance of each individual tunnel junction and an island connected to it is below the resistance quantum $$R_{T,i,j} + R_{I,i,j} < \frac{\hbar}{e^2} \approx 4\,k\Omega$$

for all i and j, where $\hbar$ is the reduced Planck constant $$\left(\frac{h}{2\pi}\right)$$

and e is the elementary charge. When the combined resistance is below $$\frac{\hbar}{e^2},$$

it may be ensured that no single charge effects are present. Thus, the linear operation of the device is ensured by having the combined resistance of each tunnel junction and an island connected to it below $$\frac{\hbar}{e^2}.$$

What comes to the size of the array, the tunnel junction network is fully customizable for impedance matching a line or a device, to achieve optimal thermalization gradient, which is dependent on the application, within the filter. Similarly, multiple arrays may be combined to realize circuit networks according to the application requirements.

Using tunnel junctions in the dissipative device is advantageous, e.g. when compared to the use of thin films. Thin films may typically be considered to have a thickness of approximately 10 nm to 1 μm. It may be difficult for hot electrons generated by dissipation to deliver their energy to the phonon bath e.g. due to small volume and/or thickness of thin films. The use of tunnel junctions, where the dissipated electrical power is directly delivered to the electrodes connecting the junction, allows the junction with heat sink electrodes to be internally characterized by high thermal conductivity towards the phonon bath independently of the impedance determined by the tunnel junction. Hot electrons produced by dissipation in the tunnel junctions will easily find the thermalization islands. The cryogenic impedance of a tunnel junction is highly predictable from room temperature results. Absence of superconductivity and diffusion results in tunnel junction resistance that is not dependent on the magnetic field, which enables stable operation under broad conditions, e.g. under high magnetic fields.

Electron-phonon coupling may be further maximized, or at least increased, by separate heat sinks, or thermalization islands, connected to the junctions' leads. The thermal coupling of the heat sinks, i.e. the islands, to the environment may be tuned without altering the attenuator's frequency response significantly. When a plurality of tunnel junctions are connected in an array, good control over the device's resistance is achieved. In other words, array design allows for flexible impedance matching and frequency response. Array of tunnel junctions further enables control of the electron temperature on each node, i.e. on each heat sink. The first columns of the thermalization islands, i.e. the columns near the input electrode 210, 310 might have higher temperature than the ones near the output electrode 212, 312. The array structure allows to have fine control on the temperature profile, depending on how much total power must be dissipated at a certain cryostat temperature stage. Since the tunnel junctions are compact in space and the tunnel junctions are distributed in the array structure, flat frequency response and uniform attenuation may be achieved in 1 GHz to 20 GHz frequency band, especially in the 3 GHz to 10 GHz frequency band.

A resistive barrier may be considered strong or weak with respect to how transparent the barrier is to the incoming electron flow. Transparency depends on the thickness of the barrier. Weak barrier means higher transparency to the incoming electron flow. For a tunnel junction to be considered as transparent, order of magnitude of the thickness of the insulating layer may be approximately 1 nm. Since high transparency tunnel junctions realize the required dissipation with compact size, e.g. with approximately 1×1 μm size, negligible parasitic capacitance is achieved.

The attenuator as disclosed herein enables efficient thermalization of RF lines, e.g. down to few mK, e.g. to 2 mK, e.g. about 10 to 20 mK temperature with good electron-phonon coupling, and without degradation from finite electronic thermal conductivity. The attenuator is compact, reliable, and reproducible and prevents decoherence by thermal photons in signal lines for quantum technology applications.

The dissipating element as disclosed herein enables efficient thermalization of lower frequency components than the RF components, to realize for example a voltage divider.

Figure 3:
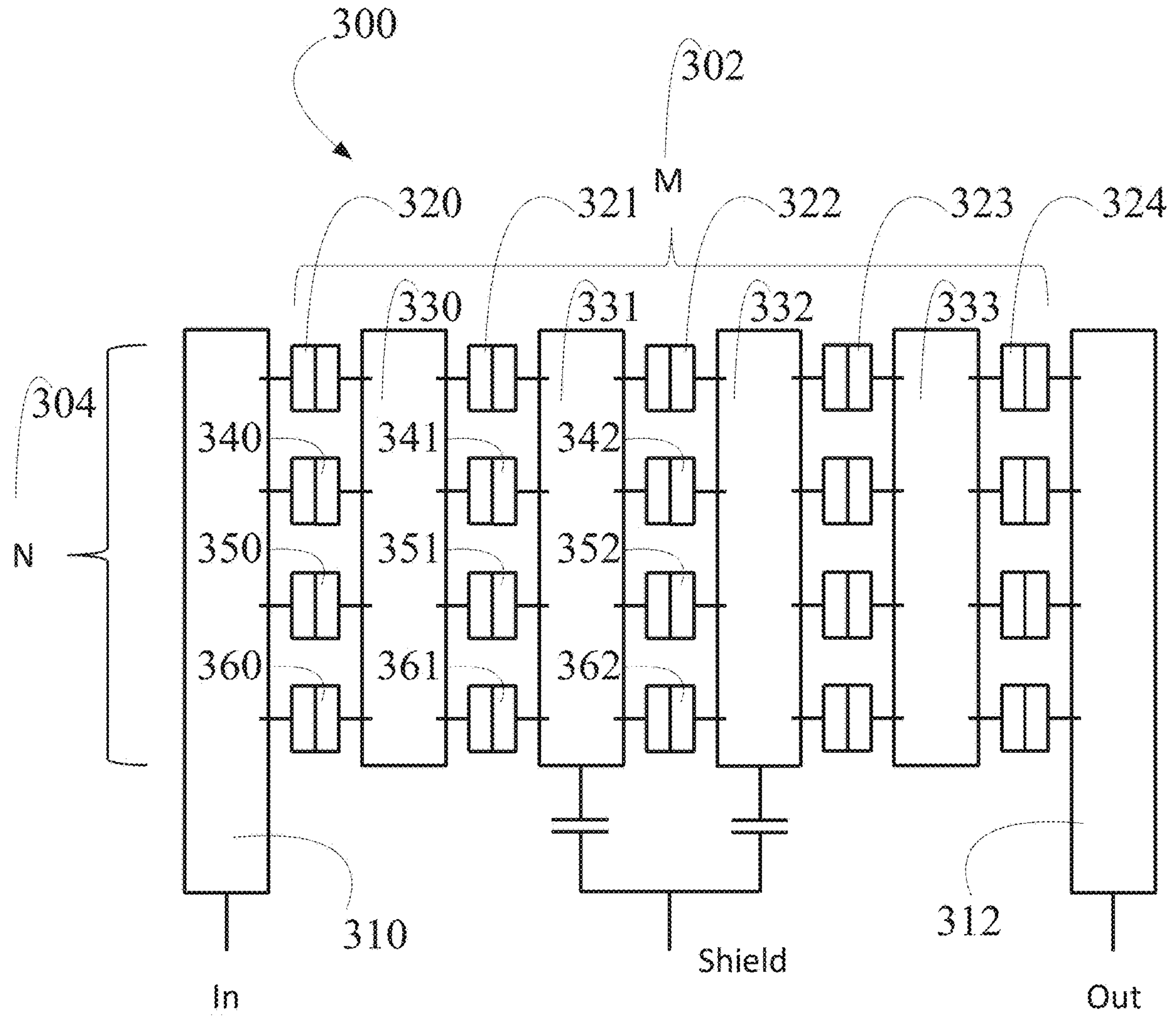
FIG. 3 shows, by way of example, a diagram of a dissipative device.

FIG. 3 shows, by way of example, a diagram of a dissipative device 300, which is coupled in between an input electrode 310 and an output electrode 312. The device comprises an array of tunnel junctions 320, 321, 322, 323, 324. Array may be considered as a structure comprising N 304 rows and M 302 columns. The size of an array may be chosen to be suitable for the application. Array may comprise one or more rows. The rows, e.g. each row, may comprise a plurality of tunnel junctions 320, 321, 322, 323, 324 e.g. at least a first tunnel junction 320, a second tunnel junction 321, and a third tunnel junction 322.

The dissipative device comprises heat sinks 330, 331, 332, 333 in between the tunnel junctions, connected to the junctions' leads. Input 310 and output electrode 312 may operate as heat sinks and electrical conductors at the same time, which may enable easier manufacturing of the device. For example, at least a first heat sink 330 is coupled to the first tunnel junction 320 and the second tunnel junction 321, and a second heat sink 33 1 is coupled to the second tunnel junction 321 and the third tunnel junction 322. The heat sinks are arranged to provide heat dissipation via electron-phonon coupling. In the example of FIG. 3, the heat sinks are common for two or more rows such that the same heat sink, e.g. the first heat sink 330 is coupled to the first tunnel junctions 320, 340, 350, 360 and the second tunnel junctions 321, 341, 351, 361 of the two or more rows. Similarly, the second heat sink 331 is common for two or more rows such that it is coupled to the second tunnel junctions 321, 341, 351, 361 and the third tunnel junctions 322, 342, 352, 362 of the two or more rows.

Each heat sink or island are connected to the shield or ground plane. The shield is connected to the ground either capacitively or galvanically. FIG. 3 shows the grounding for two heat sinks for simplicity. In at least some embodiments, no additional shield layer is used but directly through chip capacitive coupling to a holder is used. Grounding may depend on a system geometry, for example.

Figure 4A:
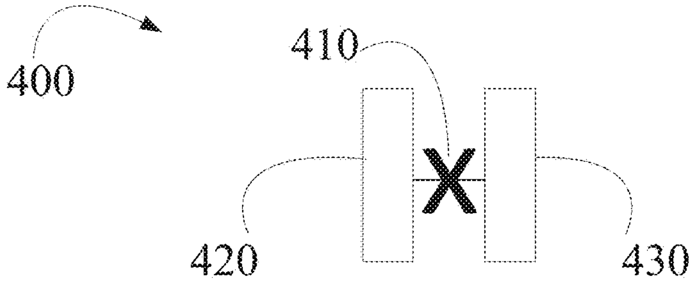
FIG. 4A shows, by way of example, a tunnel junction assembly.

FIG. 4A shows, by way of example, a tunnel junction assembly 400. A tunnel junction 410 is coupled to heat sinks 420, 430, or a metal island, or rather to halves of heat sinks. The heat sinks 420 and 430 may be coupled to the shield. The dissipative device may be manufactured from these kinds of assemblies by connecting them to series to form a row, and a plurality of rows may be connected in parallel. Tunnel junctions have a resistance value $R_T$.

Figure 4B:
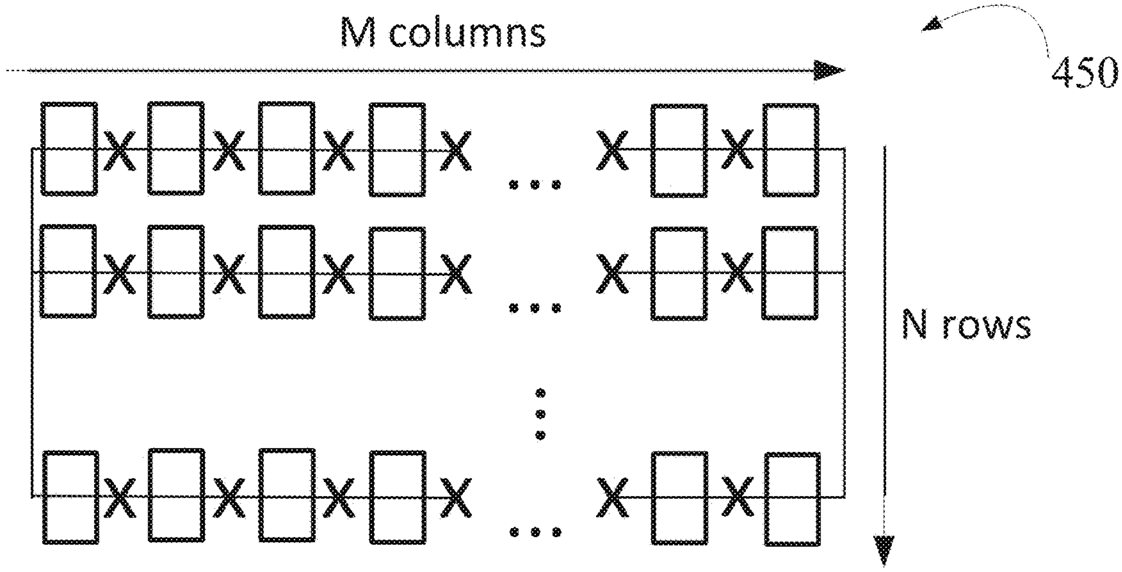
FIG. 4B shows, by way of example, a tunnel junction array.

FIG. 4B shows, by way of example, a tunnel junction array 450. The array may be considered to be comprised of a number of tunnel junction assemblies of FIG. 4A. The array comprises M columns in a row. The array comprises N rows. The array forms a flexible dissipative network, wherein the number of junctions and heat sinks may be tuned to be suitable for specific application.

Figure 4C:
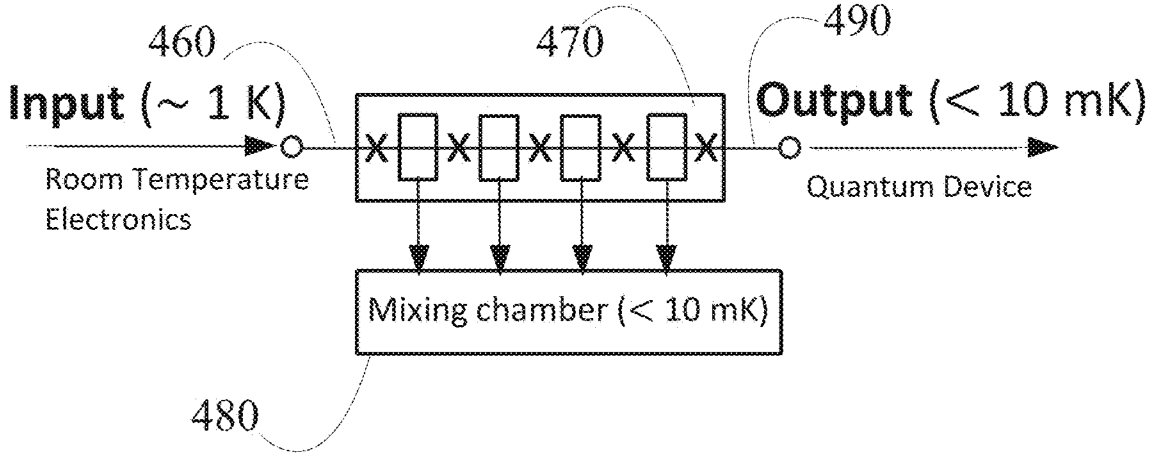
FIG. 4C shows, by way of example, attenuation scheme for quantum devices.

FIG. 4C shows, by way of example, attenuation scheme for quantum devices.

The signal from room temperature electronics is first cooled in the upper stages of the dilution refrigerator, and before entering the mixing chamber 480, the temperature of the input signal 460 may be e.g. approximately 1 K. The dissipative device 470 is in thermal contact with the mixing chamber 480. The dissipative device operates as an attenuator for cooling the input signal, e.g. down to temperatures less than approximately 10 mK. The cooled signal, i.e. the output signal 490, may be an input to a device, e.g. a quantum device such as a qubit.

Figure 5:
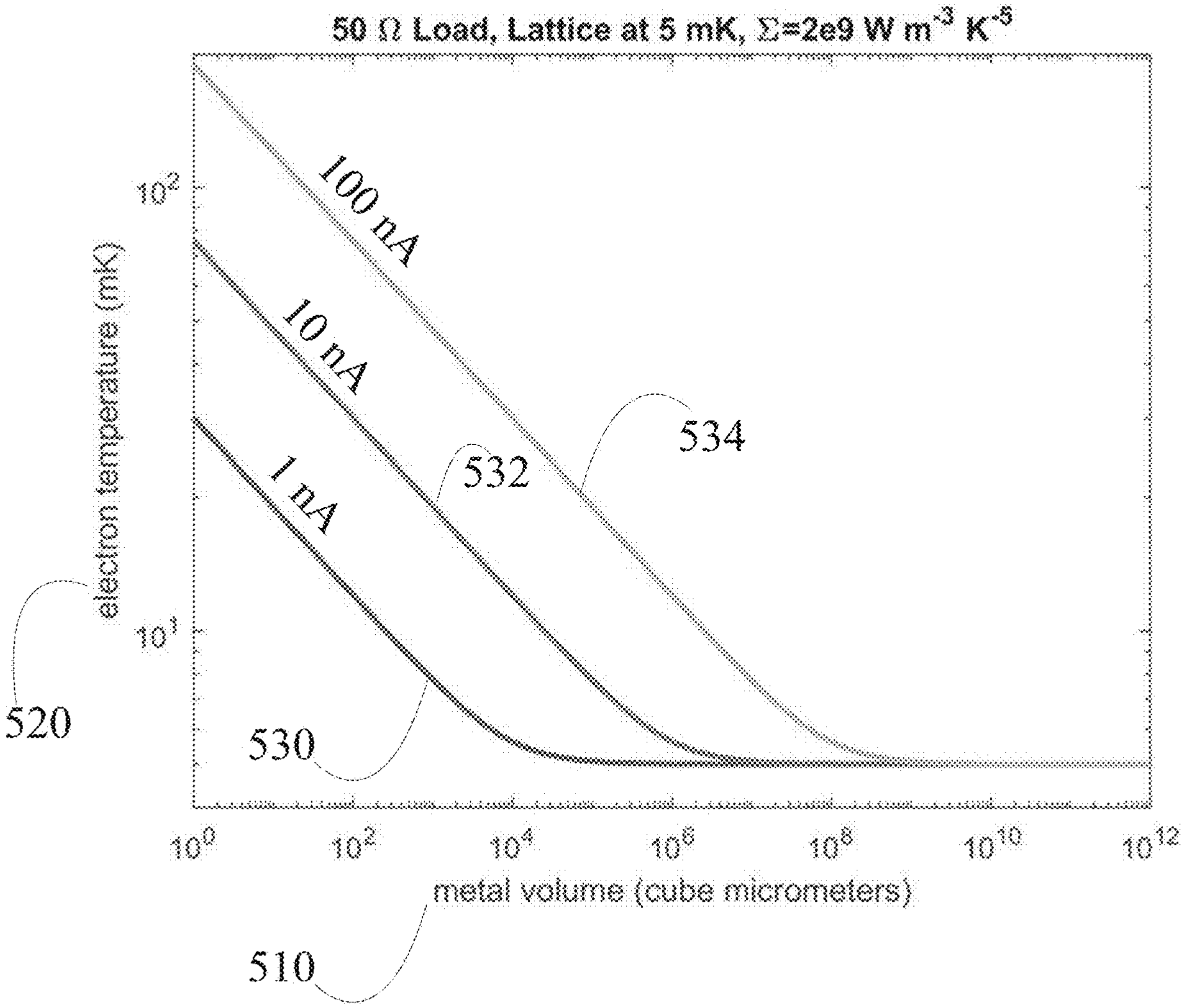
FIG. 5 shows, by way of example, effect of heat sink volume to electron temperature.

FIG. 5 shows, by way of example, the effect of metal heat sink volume 510 on electron temperature 520. The metal used as a material of the heat sink comprises the available volume for electron-phonon coupling according to $$P_{e-p} = \sum V_m (T_e^n - T_p^n),$$

with n =5 and the phonons at a constant temperature of 5 mK, corresponding to the mixing chamber temperature of a dilution refrigerator. Assuming a typical value of $\Sigma=2\cdot10^9$ W $m^{-3}$ $K^{-5}$, the achievable electron temperature $T_e$ in the dissipative device is evaluated for currents in the range of 1-100 nA, dissipated on a 50Ω load. The curve 530 is for the current of 1 nA, the curve 532 is for the current of 10 nA, and the curve 534 is for the current of 100 nA. The constant power raises the electron temperature to a value above 5 mK, which is plotted on the ordinate.

It may be seen from the graphs that a suitable volume for the heat sinks, allowing an equilibrium electron temperature down to about 10 mK, would be a volume of at least 106 $\mu m^3$. Let us consider that a realistic volume which can be integrated by, e.g., electrochemical deposition, onto a single island is of the order of 103-104 $\mu m^3$. Assuming that the dissipated power distributes evenly over the islands, an island number of 100-1000 may be necessary for efficient electron-phonon thermalization in the presence of significant dissipation. This is merely an example illustrating how a suitable number of islands may be defined in an exemplary application. In at least some embodiments, the total number of the islands or heat sinks is at least 10 or 100. In at least some embodiments, the total number of the islands or heat sinks is 100-1000.

The manufacturing process involves etching metallic thin films into separate, isolated islands, which are passivated by the tunnel barrier dielectric, realized by either oxidation of the metal or deposition of a sufficiently thin insulating film. A second layer of metal is then deposited and etched in a way that it connects to passivated islands and thus gives rise to two tunnel junctions per island. Alternatively a stack of metals is deposited in a way that a tunnel junction is introduced by oxidation between the metal layers, followed by etching of the whole stack. The individual metallic electrodes can be addressed by a spacer passivation layer, which enables to make galvanic contact to only the top metallic electrode. The metal heat sinks are deposited by electrochemical deposition of a metal into a predefined mask of photoresist or patterned insulator. The process is adapted in such a way that electrical contact is made to each metal island and each island is coated with a specific volume suitable for efficient electron-phonon thermalization.

Side-wall passivation junction (SWAPS) formation technology may be used to fabricate the tunnel junctions.

Alternatively, the tunnel junction may be fabricated by oxidation of a metal which is not superconducting down to the lowest achievable temperatures so far. Example of this kind of tunnel junction is described in the context of FIGS. 2D and 2E.

The attenuator or dissipating element as disclosed herein may be used in cryogenic applications, wherein minimization or at least reduction of thermal noise is required, or signal conditioning including filtering and amplitude reduction. The attenuator or dissipating element may be part of a system, an apparatus or a device that is configured to cool an input signal, i.e. reduce thermal noise in an input signal, e.g. to a qubit or any other cryogenic device which is sensitive to thermal noise.

A Coulomb blockade thermometer (CBT) is a primary thermometer which is suitable for cryogenic temperatures. CBT is based on properties of the Coulomb blockade in arrays of tunnel junctions. In Coulomb blockade thermometry, the first derivative of the current-voltage curve is measured and from the properties of this curve, the absolute temperature may be extracted using natural constants and the width of the dip in the differential conductance, measured at its half-depth. The full width at half minimum of the measured differential conductance dip is $V_{1/2}=5.439\ Nk_BT/e$, wherein N is the number of tunnel junctions on one row, kB is the Boltzmann constant, T is temperature and e is the elementary charge. Array as shown in FIG. 2A or FIG. 3 may be used as a sensor component in a CBT, when the combined resistance of each tunnel junction and an island connected to it is above $$\frac{\hbar}{e^2}.$$

When the combined resistance is above this limit, such an amount of single charge effects is present which is needed for the functionality of the CBT. Structure of the tunnel junctions may be, for example, as shown in FIG. 2B.

Thus, according to an embodiment, a CBT comprises a sensor component coupled in between an input electrode and an output electrode, wherein the sensor component comprises an array of tunnel junctions comprising at least one row of tunnel junctions, wherein the at least one row comprises at least a first tunnel junction, a second tunnel junction and a third tunnel junction; at least a first heat sink and a second heat sink, wherein the first heat sink is coupled to the first tunnel junction and the second tunnel junction; and the second heat sink is coupled to the second tunnel junction and the third tunnel junction; wherein the first heat sink and the second heat sink are arranged to provide heat dissipation via electron-phonon coupling. The tunnel junctions comprise TiW—Al—AlOx—Al—TiW junctions. That is, the insulating layer is aluminium oxide layer and the electrically conducting volumes are aluminium layers, wherein the absence of superconductivity is achieved by a galvanic contact between the aluminium layers and a titanium-tungsten layer. Alternatively, the tunnel junctions comprise Sc/ScOx/Sc junctions, as shown in FIG. 2D. The heat sink comprises a metal volume for thermalization, wherein the metal is characterized by an absence of superconductivity. Thermalization here means that the CBT design aims to keep the temperature of the electrons, which are between tunnel junctions, as close as possible to the temperature of the crystal lattice vibrations (phonons). Phonons provide the thermal contact to the object(s) the temperature of which is to be measured using the CBT. The absence of superconductivity is achieved by inverse proximity effect or by inclusion of paramagnetic material in a superconductive volume. The CBT comprises a measurement device configured to measure voltage-current dependency of the sensor component.

The invention claimed is:

1. An attenuator arranged to thermalize radio frequency components, or a dissipating element arranged to thermalize lower frequency components than radio frequency components, comprising:

at least a first heat sink and a second heat sink; and at least one tunnel junction coupled to the first heat sink and the second heat sink, wherein the first heat sink and the second heat sink are capacitively grounded and arranged to provide heat dissipation via electron-phonon coupling; and wherein, to minimize single charge effects, a combined resistance of the at least one tunnel junction and the first heat sink coupled to it is below $$\frac{\hbar}{e^2},$$

and a combined resistance of the at least one tunnel junction and the second heat sink coupled to it is below $$\frac{\hbar}{e^2};$$

and/or a total capacitance of the first heat sink is above $$\frac{e^2}{2k_bT}$$

and a total capacitance of the second heat sink is above $$\frac{e^2}{2k_bT},$$

wherein h is the Planck constant, e is the elementary charge, $k_b$ is the Boltzmann constant and T is the minimum temperature, where the attenuator or the dissipating element is arranged to be used.

2. The attenuator or the dissipating element of claim 1, wherein the combined resistance of the at least one tunnel junction and the first heat sink coupled to it is below $$\frac{\hbar}{e^2},$$

and the combined resistance of the at least one tunnel junction and the second heat sink coupled to it is below $$\frac{\hbar}{e^2},$$

wherein h is the reduced Planck constant.

3. The attenuator or the dissipating element of claim 1, wherein the first heat sink functions as an input electrode and the second first-heat sink functions as an output electrode.

4. The attenuator or the dissipating element of claim 1, further comprising an input electrode and an output electrode, and an array of tunnel junctions coupled between the input electrode and the output electrode, wherein:

the array of tunnel junctions comprises at least one row of tunnel junctions, wherein the at least one row comprises at least a first tunnel junction, a second tunnel junction and a third tunnel junction, the at least one tunnel junction comprises the second tunnel junction; and the first heat sink is coupled to the first tunnel junction and the second tunnel junction; and the second heat sink is coupled to the second tunnel junction and the third tunnel junction.

5. The attenuator or the dissipating element of claim 4, wherein the at least one row of tunnel junctions comprises two or more rows of tunnel junctions, and the first heat sink is common for the two or more rows such that the same first heat sink is coupled to the first tunnel junctions and the second tunnel junctions of each of the two or more rows.

6. The attenuator or the dissipating element of claim 1, wherein the tunnel junctions comprise an insulating layer forming a tunnel barrier between two electrically conducting volumes which are characterized by an absence of superconductivity.

7. The attenuator or the dissipating element of claim 6, wherein the absence of superconductivity is achieved by inverse proximity effect or by inclusion of paramagnetic material in a superconductive volume.

8. The attenuator or the dissipating element of claim 6, wherein the insulating layer is an aluminium oxide layer and the electrically conducting volumes are aluminium layers, wherein the absence of superconductivity is achieved by a galvanic contact between the aluminium layers and a titanium-tungsten layer.

9. The attenuator or the dissipating element of claim 6, wherein the insulating layer is a scandium oxide layer and the electrically conducting volumes are scandium layers, wherein the absence of superconductivity is achieved by using scandium which is not superconducting.

10. The attenuator or the dissipating element of claim 1, wherein the heat sinks comprise a metal volume for thermalization, wherein the metal is characterized by an absence of superconductivity.

11. The attenuator or the dissipating element of claim 1, wherein a thickness of the heat sinks is at least 10 μm and/or a total volume of the heat sinks is at least $10^5$ $\mu m^3$.

12. The attenuator or the dissipating element of claim 1, wherein the heat sinks comprise copper or gold.

13. The attenuator or the dissipating element of claim 1, wherein coupling between the heat sinks and the tunnel junctions is arranged by a metal layer traversing on top of the tunnel junctions.

14. The attenuator or the dissipating element of claim 13, further comprising dielectric material under the metal layer for preventing electrical connection between two electrically conducting volumes of the tunnel junction.

15. The attenuator or the dissipating element of claim 13, wherein the metal layer is arranged to surround the attenuator or the dissipating element forming shields between adjacent attenuators or dissipating elements.

16. The attenuator of claim 1, wherein an input electrode of the attenuator is arranged to receive a signal with frequency of GHz scale.

17. The attenuator or the dissipating element of claim 1, wherein the at least one tunnel junction comprises a tunnel junction structure comprising on a substrate a tunnel junction formed between normal metal layers, wherein the tunnel junction comprises an insulator layer between metal layers, wherein:

a first layer is a normal metal layer on the substrate, wherein material of the first layer is one of: TiW, Sc, W;

a second layer is a metal layer on the first layer, wherein material of the second layer is one of: TiW, Sc, W, Ti, Al;

a third layer is an insulator layer on the second layer, wherein material of the third layer is one of: TiOx, AlOx, WOx, ScOx;

a fourth layer is a metal layer on the third layer, wherein material of the fourth layer is one of: TiW, Sc, W, Ti, Al; and a fifth layer is a normal metal layer on the fourth layer, wherein material of the fifth layer is one of: TiW, Sc, or W.

18. A system comprising:

a dilution refrigerator;

a quantum processor; and one or more attenuators or dissipating elements according to claim 1.

* * * * *